(12) United States Patent
Uetani (10) Patent No.: US 10,916,720 B2
(45) Date of Patent: Feb. 9, 2021

(54) ORGANIC PHOTOELECTRIC CONVERSION DEVICE AND PRODUCTION METHOD THEREOF

(71) Applicant: SUMITOMO CHEMICAL COMPANY, LIMITED, Tokyo (JP)

(72) Inventor: Yasunori Uetani, Tsukuba (JP)

(73) Assignee: SUMITOMO CHEMICAL COMPANY, LIMITED, Tokyo (JP)

(*) Notice: Subject to any disclaimer, the term of this patent is extended or adjusted under 35 U.S.C. 154(b) by 72 days.

(21) Appl. No.: 15/518,618

(22) PCT Filed: Oct. 15, 2015

(86) PCT No.: PCT/JP2015/079112
§ 371 (c)(1),
(2) Date: Apr. 12, 2017

(87) PCT Pub. No.: WO2016/063781
PCT Pub. Date: Apr. 28, 2016

(65) Prior Publication Data
US 2017/0229667 A1 Aug. 10, 2017

(30) Foreign Application Priority Data
Oct. 21, 2014 (JP) .................................. 2014-214220

(51) Int. Cl.
*H01L 51/44* (2006.01)
*C08G 61/12* (2006.01)
(Continued)

(52) U.S. Cl.
CPC ............ *H01L 51/441* (2013.01); *B82Y 20/00* (2013.01); *B82Y 40/00* (2013.01); *C08G 61/122* (2013.01);
(Continued)

(58) Field of Classification Search
CPC ..................................................... H01L 51/441
See application file for complete search history.

(56) References Cited

U.S. PATENT DOCUMENTS

2008/0236657 A1    10/2008    Brabec et al.
2008/0258612 A1*   10/2008    Kim ..................... H01L 51/5215
                                                        313/504
(Continued)

FOREIGN PATENT DOCUMENTS

JP     2010114316 A    5/2010
JP     2010524240 A    7/2010
(Continued)

OTHER PUBLICATIONS

International Search Report, issued by International Searching Authority in corresponding International Application No. PCT/JP2015/079112, dated Nov. 17, 2015.
(Continued)

*Primary Examiner* — Eugene Lee
(74) *Attorney, Agent, or Firm* — Sughrue Mion, PLLC (57) ABSTRACT

An organic photoelectric conversion device having an anode, a cathode, an active layer disposed between the anode and the cathode, and a hole injection layer disposed between the anode and the active layer, wherein the anode is an electrode containing an electrically conductive nano-substance and the hole injection layer is a layer showing a of 80% or more in measurement of the residual film rate after a water rinse treatment.

8 Claims, 1 Drawing Sheet

(51) Int. Cl.
*H01L 51/00* (2006.01)
*H01L 51/42* (2006.01)
*B82Y 20/00* (2011.01)
*B82Y 40/00* (2011.01)

(52) U.S. Cl.
CPC ........ *C08G 61/123* (2013.01); *H01L 51/0031* (2013.01); *H01L 51/4253* (2013.01); *C08G 2261/146* (2013.01); *C08G 2261/1412* (2013.01); *C08G 2261/3246* (2013.01); *C08G 2261/344* (2013.01); *C08G 2261/414* (2013.01); *C08G 2261/95* (2013.01); *H01L 51/0035* (2013.01); *H01L 51/0036* (2013.01); *H01L 51/0043* (2013.01); *H01L 51/0047* (2013.01); *H01L 51/0048* (2013.01); *Y02E 10/549* (2013.01); *Y02P 70/50* (2015.11)

(56) References Cited

U.S. PATENT DOCUMENTS

| | | | |
|---|---|---|---|
| 2008/0319207 A1* | 12/2008 | Laird | B82Y 10/00 549/29 |
| 2009/0072780 A1 | 3/2009 | Lee et al. | |
| 2010/0263727 A1* | 10/2010 | Oyamada | B82Y 10/00 136/263 |
| 2010/0292399 A1 | 11/2010 | Brown et al. | |
| 2011/0042657 A1* | 2/2011 | Shi | H01L 51/5012 257/40 |
| 2011/0042665 A1 | 2/2011 | Uetani | |
| 2011/0042695 A1* | 2/2011 | Oyamada | H01L 51/5206 257/88 |
| 2011/0192464 A1* | 8/2011 | Urano | B82Y 30/00 136/263 |
| 2012/0241003 A1* | 9/2012 | Wachi | H01L 51/4246 136/263 |
| 2012/0286300 A1* | 11/2012 | Kijima | H01L 51/5275 257/88 |
| 2013/0099224 A1* | 4/2013 | Iijima | C07D 471/04 257/40 |
| 2014/0070189 A1* | 3/2014 | Leem | H01L 51/5203 257/40 |
| 2016/0111669 A1* | 4/2016 | Uetani | H01L 51/0031 257/40 |

FOREIGN PATENT DOCUMENTS

| | | |
|---|---|---|
| JP | 2012-234970 A | 11/2012 |
| JP | 2013089685 A | 5/2013 |
| JP | 2014-90114 A | 5/2014 |
| WO | 2008122027 A2 | 10/2008 |
| WO | 2014/045021 A1 | 3/2014 |

OTHER PUBLICATIONS

Yu-Hong Lin et al., "High-efficiency inverted polymer solar cells with solution-processed metal oxides", Solar Energy Materials & Solar Cells, vol. 95, 2011, pp. 2511-2515, 5 pages total.

Translation of Communication dated Mar. 2, 2020, issued by the State Intellectual Property Office of the P.R.C. in application No. 201580055309.3.

Translation of Communication dated Dec. 3, 2019 (drafted Nov. 27, 2019), issued by the Japanese Patent Office in application No. 2016-555191.

Third Office Action dated Jun. 24, 2019 in corresponding Chinese Patent Application No. 201580055309.3 with translation.

* cited by examiner

ORGANIC PHOTOELECTRIC CONVERSION DEVICE AND PRODUCTION METHOD THEREOF

CROSS REFERENCE TO RELATED APPLICATIONS

This application is a National Stage of International Application No. PCT/JP2015/079112 filed Oct. 15, 2015, claiming priority based on Japanese Patent Application No. 2014-214220, filed Oct. 21, 2014, the contents of all of which are incorporated herein by reference in their entirety.

TECHNICAL FIELD

The present invention relates to an organic photoelectric conversion device and a production method thereof.

PRIOR ART

An organic photoelectric conversion device used in organic solar batteries, optical sensors and the like is constituted of a pair of electrodes (anode and cathode) and an active layer disposed between the electrodes, and fabricated by laminating the electrodes, the active layer and the like sequentially in the prescribed order.

For example, there is known a method for producing a semi-transparent organic photoelectric conversion device in which a functional layer composed of titanium oxide and an active layer are formed in this order on a cathode composed of ITO, a solution containing poly(3,4-ethylenedioxythiophene)/poly(4-styrenesulfonic acid) (PEDOT/PSS) is applied on this to form a hole injection layer, then, further, an aqueous solution containing silver nanorods is applied to form an anode (see, Patent document 1).

PRIOR ART DOCUMENT

Patent Document (Patent document 1) Japanese Patent Application National Publication No. 2010-524240

SUMMARY OF THE INVENTION

However, the organic photoelectric conversion device described in Patent document 1 mentioned above has low photoelectric conversion efficiency.

The present invention has an object of providing an organic photoelectric conversion device with which high photoelectric conversion efficiency is obtained and a production method thereof.

The present invention is as described below.

[1] An organic photoelectric conversion device having an anode, a cathode, an active layer disposed between the anode and the cathode, and a hole injection layer disposed between the anode and the active layer, wherein the anode is an electrode containing an electrically conductive nanosubstance and the hole injection layer is a layer having a residual film rate of 80% or more in measurement of the residual film rate after a water rinse treatment shown below:
<Method of Measurement of Residual Film Rate after Water Rinse Treatment>
On a 1-inch square substrate, a film is formed by spin coating so as to give the same film thickness as in the case of film formation as a hole injection layer in the organic photoelectric conversion device, then, a water rinse treatment in which water is placed in the form of meniscus on the film, allowed to stand still for 30 seconds, then, the film is spun at 4000 rpm to fling away water is conducted. The film thicknesses before and after the water rinse treatment are measured by a contact type thickness meter, and (film thickness after water rinse treatment)/(film thickness before water rinse treatment)×100(%) is defined as the residual film rate after water rinse treatment.

[2] The organic photoelectric conversion device according to [1], wherein the electrically conductive nanosubstance is at least one nanosubstance selected from the group consisting of electrically conductive nanowires, electrically conductive nanotubes and electrically conductive nanoparticles.

[3] The organic photoelectric conversion device according to [1] or [2], having a constitution in which the cathode, the active layer, the hole injection layer and the anode are laminated in this order.

[4] The organic photoelectric conversion device according to any one of [1] to [3], further having a functional layer between the cathode and the active layer.

[5] The organic photoelectric conversion device according to [4], wherein the functional layer is a layer formed by applying an application liquid containing granulous zinc oxide.

[6] The organic photoelectric conversion device according to any one of [1] to [5], wherein the active layer is a layer formed by an application method.

[7] The organic photoelectric conversion device according to any one of [1] to [6], wherein the anode is an electrode formed by applying an application liquid containing water and a nanosubstance.

[8] The organic photoelectric conversion device according to any one of [1] to [7], wherein the active layer contains a fullerene and/or a derivative of a fullerene and a conjugated polymer compound.

[9] An organic optical sensor having the organic photoelectric conversion device according to any one of [1] to [7].

[10] A method of producing an organic photoelectric conversion device having a supporting substrate, an anode and a cathode, and a hole injection layer and an active layer between the anode and the cathode, comprising a step of forming an active layer on a cathode formed on a supporting substrate, a step of forming a hole injection layer on the active layer and a step of forming an anode by applying an application liquid containing water and a nanosubstance after the step of forming a hole injection layer, wherein the hole injection layer is a layer having a residual film rate of 80% or more in measurement of residual film rate after a water rinse treatment of a film shown below:
<Method of Measurement of Residual Film Rate after Water Rinse Treatment>
On a 1-inch square substrate, a film is formed by spin coating so as to give the same film thickness as in the case of film formation as a hole injection layer in the organic photoelectric conversion device, then, a water rinse treatment in which water is placed in the form of meniscus on the film, allowed to stand still for 30 seconds, then, the film is spun at 4000 rpm to fling away water is conducted. The film thicknesses before and after the water rinse treatment are measured by a contact type thickness meter, and (film thickness after water rinse treatment)/(film thickness before water rinse treatment)×100(%) is defined as the residual film rate after water rinse treatment.

MODES FOR CARRYING OUT THE INVENTION

The present invention will be illustrated in detail below.

<1> Constitution of Organic Photoelectric Conversion Device

Figure 1:
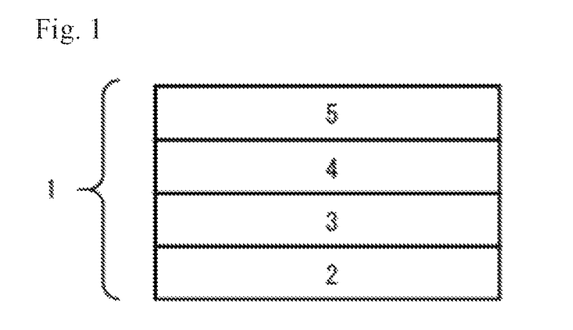
FIG. 1 illustrates an organic photoelectric conversion device in accordance with the invention including a cathode, active layer, hole injection layer and anode.

Referring to FIG. 1, the organic photoelectric conversion device 1 of the present invention is an organic photoelectric conversion device having an anode 5, a cathode 2, an active layer 3 disposed between the anode and the cathode, and a hole injection layer 4 disposed between the anode and the active layer, wherein the anode is an electrode containing an electrically conductive nanosubstance and the hole injection layer is a layer having a residual film rate of 80% or more in measurement of the residual film rate after a water rinse treatment.

Figure 2:
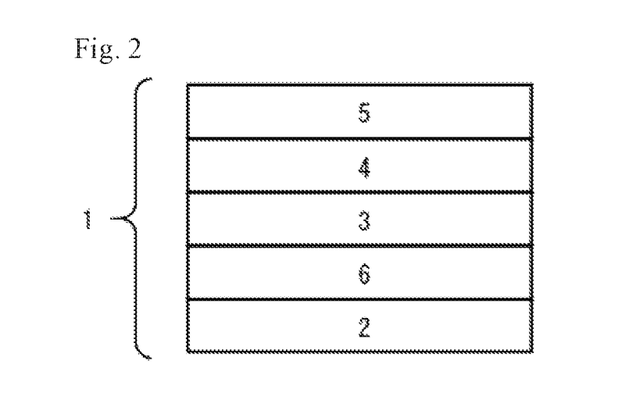
FIG. 2 illustrates another embodiment of an organic photoelectric conversion device in accordance with the invention including a cathode, active layer, hole injection layer, anode and functional layer.

Referring to FIG. 2, the organic photoelectric conversion device 1 of the present invention preferably has a constitution in which a cathode 2, an active layer 3, a hole injection layer 4 and an anode 5 are laminated in this order, and more preferably has a constitution further having a functional layer 6 between a cathode and an active layer.

At least one of an anode and a cathode is constituted of a transparent or semi-transparent electrode. Incident light from a transparent or semi-transparent electrode is absorbed by an electron accepting compound and/or an electron donating compound described later in an active layer, thereby generating an exciton composed of an electrode and a hole bound. When this exciton travels in the active layer and reaches the hetero junction interface at which an electron accepting compound and an electron donating compound are adjacent, an electron and a hole separate due to a difference of the respective HOMO energy and LUMO energy at the interface, to generate independently movable charges (electron and hole). The generated charges move to respective electrodes and extracted to the outside as electric energy (electric current).

(Supporting Substrate)

The organic photoelectric conversion device of the present invention is usually formed on a supporting substrate. As the supporting substrate, one which does not chemically change in fabricating an organic photoelectric conversion device is suitably used. The supporting substrate includes, for example, a glass substrate, a plastic substrate, a polymer film, a silicon plate and the like. In the case of an organic photoelectric conversion device having a constitution taking in light from a transparent or semi-transparent anode, a substrate having high light permeability is suitably used as the supporting substrate. When an organic photoelectric conversion device is fabricated on an opaque substrate, a cathode is constituted of a transparent or semi-transparent electrode since light cannot be taken in from the anode side. By using such an electrode, light can be taken in from a cathode opposite to an anode provided on the side of a supporting substrate even if the supporting substrate is opaque.

When the organic photoelectric conversion device of the present invention is formed on a supporting substrate, the organic photoelectric conversion device of the present invention preferably has a constitution in which a supporting substrate, a cathode, an active layer, a hole injection layer and an anode are laminated in this order, and more prefer- ably has a constitution further having a functional layer between a cathode and an active layer.

(Cathode)

As the cathode, an electrically conductive metal oxide film, a metal film, an electrically conductive film containing an organic substance, and the like are used. Specifically, use is made of films of indium oxide, zinc oxide, tin oxide, indium tin oxide (abbreviated as ITO), indium zinc oxide (abbreviated as IZO), gold, platinum, silver, copper, aluminum, polyaniline and its derivatives, polythiophene and its derivatives, and the like. Of them, films of ITO, IZO and tin oxide are suitably used as the cathode. In an organic photoelectric conversion device having a constitution taking in light from a cathode, for example, a transparent or semi-transparent electrode obtained by regulating the thickness of a film constituting the cathode to a thickness through which light can permeate is used as the cathode.

(Functional Layer)

The organic photoelectric conversion device sometimes has a prescribed functional layer not limited to an active layer between electrodes. As such a functional layer, a functional layer containing an electron transportable material is preferably provided between an active layer and a cathode.

The functional layer is preferably formed by an application method, and for example, it is preferable that the functional layer is formed by applying an application liquid containing an electron transportable material and a solvent on the surface of a layer on which the functional layer is to be provided. In the present invention, the application liquid includes also dispersions such as an emulsion, a suspension and the like.

The electron transportable material includes, for example, zinc oxide, titanium oxide, zirconium oxide, tin oxide, indium oxide, ITO (indium tin oxide), FTO (fluorine-doped tin oxide), GZO (gallium-doped zinc oxide), ATO (antimony-doped tin oxide) and AZO (aluminum-doped zinc oxide), and of them, zinc oxide, gallium-doped zinc oxide or aluminum-doped zinc oxide is preferable. When a functional layer is formed, it is preferable to form the functional layer by film-forming an application liquid containing granulous zinc oxide, gallium-doped zinc oxide or aluminum-doped zinc oxide. As the electron transportable material described above, so-called nanoparticles of zinc oxide, gallium-doped zinc oxide or aluminum-doped zinc oxide are preferably used, and it is more preferable to form a functional layer using an electron transportable material solely composed of nanoparticles of zinc oxide, gallium-doped zinc oxide or aluminum-doped zinc oxide. The sphere-equivalent average particle size of zinc oxide, gallium-doped zinc oxide or aluminum-doped zinc oxide is preferably 1 nm to 1000 nm, preferably 10 nm to 100 nm. The average particle size is measured by a laser light scattering method or an X-ray diffraction method.

By providing a functional layer containing an electron transportable material between a cathode and an active layer, efficiency of injection of electrons from an active layer to a cathode can be enhanced. It is preferable that a functional layer is provided in contact with an active layer, and it is preferable that a functional layer is provided further in contact also with a cathode. By providing such a functional layer, an organic photoelectric conversion device having high reliability and showing high photoelectric conversion efficiency can be realized.

A functional layer containing an electron transportable material functions as a so-called electron transporting layer and/or electron injection layer. By providing such a functional layer, efficiency of injection of electrons into a cathode can be enhanced, injection of holes from an active layer can be prevented, electron transporting capability can be enhanced, an active layer can be protected from erosion by an application liquid used in forming a cathode by an application method, and deterioration of an active layer can be suppressed.

It is preferable that an application liquid containing an electron transportable material contains at least one selected from the group consisting of a complex of an alkali metal, a salt of an alkali metal, a complex of an alkaline earth metal, and a salt of an alkaline earth metal (hereinafter, referred to as "complex or salt of alkali metal or alkaline earth metal" in some cases). By using such an application liquid, a functional layer containing a complex or salt of an alkali metal or alkaline earth metal can be formed. By containing a complex or salt of an alkali metal or alkaline earth metal, electron injection efficiency can be further enhanced.

It is preferable that a complex or salt of an alkali metal or alkaline earth metal is soluble in the solvent of the application liquid described above. The alkali metal includes lithium, sodium, potassium, rubidium and cesium. The alkaline earth metal includes magnesium, calcium, strontium and barium. The complex includes β-diketone complexes, and the salt includes alkoxides, phenoxides, carboxylates, carbonates and hydroxides.

Specific examples of the complex or salt of an alkali metal or alkaline earth metal include sodium acetylacetonate, cesium acetylacetonate, calcium bis(acetylacetonate), barium bis(acetylacetonate), sodium methoxide, sodium phenoxide, sodium tert-butoxide, sodium tert-pentoxide, sodium acetate, sodium citrate, cesium carbonate, cesium acetate, sodium hydroxide, cesium hydroxide and the like.

Of them, sodium acetylacetonate, cesium acetylacetonate and cesium acetate are preferable.

In an application liquid containing an electron transportable material, the total amount of a complex or salt of an alkali metal or alkaline earth metal is 1 to 1000 parts by weight, preferably 5 to 500 parts by weight when the amount of a granulous electron transportable material is 100 parts by weight.

In addition, polymers having a polar group in the side chain, for example, polyethylene oxide (PEO), polyethyleneimine ethoxide (PEIE), polyethyleneimine (PEI), [(9,9-bis(30-(N,N-dimethylamino)propyl)-2,7-fluorene)-alt-2,7-(9,9-dioctylfluorene)] (PFN), (WPF-oxy-F), (WPF-6-oxy-F) and the like can be used, in the functional layer.

(Active Layer)

The active layer can take a form of a single layer or a form of lamination of a plurality of layers. The active layer having a single layer constitution is constituted of a layer containing an electron accepting compound and an electron donating compound.

The active layer having a constitution of lamination of a plurality of layers is, for example, constituted of a laminate formed by laminating a first active layer containing an electron donating compound and a second active layer containing an electron accepting compound. In this case, the first active layer is disposed closer to an anode than the second active layer.

The organic photoelectric conversion device may also have a constitution in which a plurality of active layers are laminated via an intermediate layer. In such a case, a multi junction type device (tandem type device) is obtained. In this case, each active layer may be of single layer type containing an electron accepting compound and an electron donating compound or may be of laminated type constituted of a laminate formed by laminating a first active layer containing an electron donating compound and a second active layer containing an electron accepting compound.

The intermediate layer can take a form of a single layer or a form of lamination of a plurality of layers. The intermediate layer is constituted of a so-called charge injection layer and/or charge transporting layer. As the intermediate layer, for example, a functional layer containing an electron transportable material described later can be used.

The active layer is preferably formed by an application method. It is preferable that the active layer contains a polymer compound, and a polymer compound may be contained singly or two or more polymer compounds may be contained in combination. For enhancing the charge transportability of the active layer, an electron donating compound and/or an electron accepting compound may be mixed in the active layer.

The electron accepting compound used in an organic photoelectric conversion device is composed of a compound having its HOMO energy higher than the HOMO energy of an electron donating compound and having its LUMO energy higher than the LUMO energy of an electron donating compound.

The electron donating compound may be a low molecular weight compound or a polymer compound. The low molecular weight electron donating compound includes phthalocyanine, metallophthalocyanine, porphyrin, metalloporphyrin, oligothiophene, tetracene, pentacene, rubrene and the like.

The polymer electron donating compound includes polyvinyl carbazole and its derivatives, polysilane and its derivatives, polysiloxane derivatives having an aromatic amine in the side chain or main chain, polyaniline and its derivatives, polythiophene and its derivatives, polypyrrole and its derivatives, polyphenylenevinylene and its derivatives, polythienylenevinylene and its derivatives, polyfluorene and its derivatives, and the like.

The electron accepting compound may be a low molecular weight compound or a polymer compound. The low molecular weight electron accepting compound includes oxadiazole derivatives, anthraquinodimethane and its derivatives, benzoquinone and its derivatives, naphthoquinone and its derivatives, anthraquinone and its derivatives, tetracyanoanthraquinodimethane and its derivatives, fluorenone derivatives, diphenyldicyanoethylene and its derivatives, diphenoquinone derivatives, metal complexes of 8-hydroxyquinoline and its derivatives, polyquinoline and its derivatives, polyquinoxaline and its derivatives, polyfluorene and its derivatives, fullerenes such as $C_{60}$ and the like and derivatives thereof, phenanthrene derivatives such as bathocuproine and the like; etc. The polymer electron accepting compound includes polyvinyl carbazole and its derivatives, polysilane and its derivatives, polysiloxane derivatives having an aromatic amine in the side chain or main chain, polyaniline and its derivatives, polythiophene and its derivatives, polypyrrole and its derivatives, polyphenylenevinylene and its derivatives, polythienylenevinylene and its derivatives, polyfluorene and its derivatives, and the like. Of them, fullerenes and its derivatives are especially preferable.

The fullerenes include $C_{60}$, $C_{70}$, carbon nanotubes, and derivatives thereof. Specific structures of the $C_{60}$ fullerene derivative include those shown below.

In the constitution in which the active layer contains an electron accepting compound composed of a fullerene and/or a derivative of a fullerene and an electron donating compound, the proportion of a fullerene and a derivative of a fullerene is preferably 10 to 1000 parts by weight, more preferably 50 to 500 parts by weight with respect to 100 parts by weight of the electron donating compound. It is preferable that the organic photoelectric conversion device has an active layer having the single layer constitution described above, and it is more preferable that the device has an active layer having the single layer constitution containing an electron accepting compound composed of a fullerene and/or a derivative of a fullerene and an electron donating compound from the standpoint of much inclusion of the hetero junction interface.

Particularly, it is preferable that the active layer contains a conjugated polymer compound and a fullerene and/or a derivative of a fullerene. The conjugated polymer compound used in the active layer includes polythiophene and its derivatives, polyphenylenevinylene and its derivatives, polyfluorene and its derivatives, a conjugated polymer compound having a constitutional unit represented by the formula (I), and the like. Among others, a conjugated polymer compound having a constitutional unit represented by the formula (I) is preferable.

(I)

In the formula (I), Z represents a group represented by any one of the formula (Z-1) to the formula (Z-7) described below. $Ar^1$ and $Ar^2$ may be the same or different, and represent a trivalent aromatic heterocyclic group.

In the formula (Z-1) to the formula (Z-7), R represents a hydrogen atom, a halogen atom, an amino group, a cyano group or a monovalent organic group. The monovalent organic group includes, for example, an optionally substituted alkyl group, an optionally substituted alkoxy group, an optionally substituted alkylthio group, an aryl group, an aryloxy group, an arylthio group, an optionally substituted arylalkyl group, an optionally substituted arylalkoxy group, an optionally substituted arylalkylthio group, an optionally substituted acyl group, an optionally substituted acyloxy group, an optionally substituted amide group, an optionally substituted acid imide group, a substituted amino group, a substituted silyl group, a substituted silyloxy group, a substituted silylthio group, a substituted silylamino group, a monovalent heterocyclic group, a heterocyclicoxy group, a heterocyclicthio group, an arylalkenyl group, an arylalkynyl group and a carboxyl group. When there are two groups R in each of the formula (Z-1) to the formula (Z-7), they may be the same or mutually different.

The constitutional unit represented by the formula (I) is preferably a constitutional unit represented by the following formula (2).

(2)

[in the formula (2), Z represents the same meaning as described above.].

The constitutional unit represented by the formula (2) includes, for example, constitutional units represented by the formula (501) to the formula (505).

[wherein R represents the same meaning as described above. When there are two groups R, they may be the same or different.].

Of constitutional units represented by the formula (501) to the formula (505) described above, preferable are constitutional units represented by the formula (501), the formula (502), the formula (503) and the formula (504), more preferable are constitutional units represented by the formula (501) and the formula (504), further preferable is a constitutional unit represented by the formula (501), from the standpoint of obtaining a highly efficient photoelectric conversion device.

The conjugated polymer compound having a constitutional unit represented by the formula (1) can be produced and used according to a method described in International Publication WO2013/051676A1.

In the present invention, the polymer compound denotes a compound having a weight-average molecular weight of 3000 or more. The weight-average molecular weight of the polymer compound is preferably 3000 to 10000000, more preferably 8000 to 5000000, further preferably 10000 to 1000000.

When the weight-average molecular weight of the polymer compound is smaller than 3000, an applying property may lower when used for fabrication of a device. When the weight-average molecular weight is larger than 10000000, solubility in a solvent and an applying property may lower when used for fabrication of a device.

The weight-average molecular weight of the polymer compound denotes a polystyrene-equivalent weight-average molecular weight measured by gel permeation chromatography (GPC).

The polystyrene-equivalent number-average molecular weight of the polymer compound is preferably 1000 to 100000000. When the polystyrene-equivalent number-average molecular weight is 1000 or more, a tough film tends to be obtained. When the polystyrene-equivalent number-average molecular weight is 100000000 or less, the solubility of the polymer compound is high and fabrication of a film is easy. The polystyrene-equivalent number-average molecular weight of the polymer compound is preferably 3000 or more.

The thickness of the active layer is usually 1 nm to 100 μm, preferably 2 nm to 1000 nm, more preferably 5 nm to 500 nm, further preferably 20 nm to 200 nm.

(Hole Injection Layer)

The hole injection layer is disposed between an anode and an active layer, and has a function of promoting injection of holes into the anode. The hole injection layer is preferably disposed in contact with an anode. The hole injection layer contained in the organic photoelectric conversion device of the present invention is a layer which is insoluble in water after film formation. The hole injection layer contained in the organic photoelectric conversion device of the present invention is a layer having a residual film rate ratio of 80% or more in measurement of the residual film rate after a water rinse treatment shown below, and the residual film rate is more preferably 90% or more, and a layer having a residual film rate of 98% to 100% is further preferable.

The thickness of the hole injection layer is usually 1 nm to 100 μm.

In the present invention, the residual film rate after water rinse treatment is determined by the following measurement method. On a 1-inch square substrate, a film is formed by spin coating so as to give the same film thickness as in the case of actual film formation as a hole injection layer in the organic photoelectric conversion device, then, a water rinse treatment in which water is placed in the form of meniscus on the film (film for measurement of residual film rate), allowed to stand still for 30 seconds, then, the film is spun at 4000 rpm to fling away water is conducted on the film. The film thicknesses before and after the water rinse treatment are measured by a contact type thickness meter, and (film thickness after water rinse treatment)/(film thickness before water rinse treatment)×100(%) is defined as the residual film rate after water rinse treatment. In the present invention, measurement was conducted using a contact type thickness meter manufactured by DEKTAK Bruker Nano, as the contact type thickness meter.

The film for measurement of the residual film rate is a film which is substantially the same as the hole injection layer of the organic photoelectric conversion device of the present invention.

More specifically, the film for measurement of the residual film rate is a film produced by using the substantially the same material as for the hole injection layer of the organic photoelectric conversion device of the present invention by substantially the same method as for the hole injection layer and having the substantially the same thickness as that of the hole injection layer.

By placing water in the form of meniscus, namely, so that water forms meniscus, on the film for measurement of the residual film rate, water can be placed so as to cover substantially the whole surface of the film.

Spin for flinging away water can be carried out by a spin coater. Flinging away of water can be visually confirmed. Usually, water can be flung away by spinning at 4000 rpm for 5 seconds or more.

The thicknesses before and after the water rinse treatment is measured at the center part of a 1-inch square substrate.

The material of the hole injection layer contained in the organic photoelectric conversion device of the present invention includes polymer compounds such as polyaniline and its derivatives, polythiophene and its derivatives, polypyrrole and its derivatives, polymer compounds having an aromatic amine residue as a repeating unit, and the like; low molecular weight compounds such as aniline, thiophene, pyrrole, aromatic amine compound and the like; and inorganic compounds such as CuSCN, CuI and the like. It is preferable that the material of the hole injection layer is at least one selected from the group consisting of polythiophene and its derivatives, aromatic amine compounds, polymer compounds having an aromatic amine residue as a repeating unit, CuSCN and CuI.

Among polythiophene and its derivatives, polythiophene derivatives having a sulfo group are preferable.

(Anode)

The anode can take a form of a single layer or a form of lamination of a plurality of layers. In the present invention, the anode contains an electrically conductive nanosubstance. The nanosubstance denotes a substance having a unidimensional, bidimensional or tridimensional size in nano scale (1000 nm or less). The nanosubstance of the present invention has a unidimensional, bidimensional or tridimensional size of preferably 500 nm or less, more preferably 100 nm or less. The electrically conductive nanosubstance includes electrically conductive nanowires, electrically conductive nanotubes, electrically conductive nanoparticles, electrically conductive nanorods, electrically conductive nanoplates, and the like. The nanoparticle denotes a nanosubstance of which sizes in three dimensions are all in nano scale. It is preferable for the nanowire that sizes in two dimensions are in nano scale and in approximately the same magnitude (the ratio of lengths of two dimensions is 1:10 or less) and the size of the other one dimension is 1000 nm or less. The size of the other one dimension is more preferably 2000 nm or more, further preferably 3000 nm or more. The nanotube is a nanosubstance having a hollow shape, and its preferable size includes the same sizes as the nanowire. It is preferable that the nanosubstance contained in a cathode is at least one selected from the group consisting of electrically conductive nanowires, electrically conductive nanotubes and electrically conductive nanoparticles. The nanosubstance is more preferably an electrically conductive nanowire and/or an electrically conductive nanotube, further preferably an electrically conductive nanowire, from the standpoint of light permeability and electrical conductivity. The electrically conductive nanowires and electrically conductive nanotubes can be entangled in a lattice pattern, to form a transparent electrically conductive film having both light permeability and electrical conductivity. The application liquid containing an electrically conductive nanosubstance and a solvent includes an emulsion, a suspension and the like containing nanoparticles of an electrically conductive substance, nanowires of an electrically conductive substance or nanotubes of an electrically conductive substance. As the solvent used in the application liquid, water is preferably contained since the nanosubstance is dispersed easily and an influence of environmental load is decreased. The electrically conductive substance includes metals such as gold, silver and the like, oxides such as ITO (indium tin oxide) and the like, and carbon materials such as graphites, fullerenes, carbon nanotubes and the like. The electrically conductive substance is preferably a metal, more preferably silver in the case of an electrically conductive nanowire or an electrically conductive nanorod. The electrically conductive substance is preferably a carbon material in the case of an electrically conductive nanotube, an electrically conductive nanoparticle and an electrically conductive nanoplate. The anode may be constituted solely of an electrically conductive nanosubstance, however, the anode may also have a constitution in which these electrically conductive nanosubstances are dispersed in a prescribed medium such as an electrically conductive polymer or the like and arranged as shown in Japanese Patent Application National Publication No. 2010-525526.

<2> Production Method of Organic Photoelectric Conversion Device

The production method of the organic photoelectric conversion device of the present invention is a method of producing an organic photoelectric conversion device having a pair of electrodes and a hole injection layer and an active layer between the pair of electrodes, comprising a step of forming an active layer on a cathode formed on a supporting substrate, a step of forming a hole injection layer on the active layer and a step of forming an anode by applying an application liquid containing water and an electrically conductive nanosubstance after the step of forming a hole injection layer, wherein the hole injection layer is a layer having a residual film rate of 80% or more in measurement of the residual film rate after a water rinse treatment.

<Cathode Formation Step>

The cathode is formed by forming a film of the cathode material exemplified on the supporting substrate described above by a vacuum vapor deposition method, a sputtering method, an ion plating method, a plating method and the like. The cathode may also be formed by an application method using an application liquid containing an organic material such as polyaniline and its derivatives, polythiophene and its derivatives and the like, a metal ink, a metal paste, a low melting point metal in melted state and the like.

<Functional Layer Formation Step>

It is preferable that a functional layer containing an electron transportable material is formed between an active layer and a cathode, as described above. That is, it is preferable that a functional layer is formed by applying an application liquid containing the electron transportable material on a cathode to form a film after formation of a cathode and before formation of the active layer.

The application liquid used in forming a functional layer by application contains a solvent and the electron transportable material described above. The solvent of the application liquid includes water, alcohols, ketones and the like, and specific examples of the alcohol include methanol, ethanol, isopropanol, butanol, ethylene glycol, propylene glycol, butoxyethanol, methoxybutanol and the like, and specific examples of the ketone include acetone, methyl ethyl ketone, methyl isobutyl ketone, 2-heptanone and cyclohexanone, and mixtures composed of two or more of them, and the like. The application liquid used in the present invention may contain two or more solvents, and the two or more solvents exemplified above may be contained.

<Active Layer Formation Step>

Though the method of forming the active layer is not particularly restricted, it is preferable to form the active layer by an application method from the standpoint of simplification of the production step. The active layer can be formed, for example, by an application method using an application liquid containing the active layer constituent material and a solvent, and for example, the active layer can be formed by an application method using an application liquid containing a conjugated polymer compound and a fullerene and/or a derivative of a fullerene, and a solvent.

The solvent includes, for example, hydrocarbon solvents such as toluene, xylene, mesitylene, tetralin, decalin, bicyclohexyl, n-butylbenzene, s-butylbenzene, t-butylbenzene and the like, halogenated saturated hydrocarbon solvents such as carbon tetrachloride, chloroform, dichloromethane, dichloroethane, chlorobutane, bromobutane, chloropentane, bromopentane, chlorohexane, bromohexane, chlorocyclohexane, bromocyclohexane and the like, halogenated unsaturated hydrocarbon solvents such as chlorobenzene, dichlorobenzene, trichlorobenzene and the like, ether solvents such as tetrahydrofuran, tetrahydropyran and the like; etc.

The application liquid used in the present invention may contain two or more solvents, and the two or more solvents exemplified above may be contained.

The method of applying an application liquid containing the active layer constituent material includes application methods such as a spin coat method, a casting method, a micro gravure coat method, a gravure coat method, a bar method, a roll coat method, a wire bar method, a dip coat method, a spray coat method, a screen printing method, a flexo printing method, an offset printing method, an inkjet printing method, a dispenser printing method, a nozzle coat method, a capillary coat method and the like, and of them, a spin coat method, a flexo printing method, an inkjet printing method and a dispenser printing method are preferable.

<Hole Injection Layer Formation Step>

The hole injection layer contained in the organic photoelectric conversion device of the present invention can be produced by appropriately selecting the constituent materials, the production conditions, the film thickness and the like.

Though the method of forming the hole injection layer is not particularly restricted, it is preferable to form the hole injection layer by an application method from the standpoint of simplification of the production step. The hole injection layer can be formed, for example, by an application method using an application liquid containing the hole injection layer constituent material and a solvent.

<Anode Formation Step>

The anode is preferably formed by an application method using an application liquid containing an electrically conductive nanosubstance and a solvent on the surface of an active layer, a functional layer or the like, and in this case, the anode is formed by applying an application liquid on the surface of a hole injection layer. As the solvent of an application liquid used in forming a cathode of the present invention, water is preferably contained. When water is contained in the solvent, water is contained in an amount of 10 parts by weight or more, preferably 50 parts by weight or more with respect to 100 parts by weight of the total amount of the solvent in the application liquid. The solvent other than water which may be contained in the application liquid includes, for example, hydrocarbon solvents such as toluene, xylene, mesitylene, tetralin, decalin, bicyclohexyl, n-butylbenzene, s-butylbenzene, t-butylbenzene and the like, halogenated saturated hydrocarbon solvents such as carbon tetrachloride, chloroform, dichloromethane, dichloroethane, chlorobutane, bromobutane, chloropentane, bromopentane, chlorohexane, bromohexane, chlorocyclohexane, bromocyclohexane and the like, halogenated unsaturated hydrocarbon solvents such as chlorobenzene, dichlorobenzene, trichlorobenzene and the like, ether solvents such as tetrahydrofuran, tetrahydropyran and the like, alcohols, and the like. Specific examples of the alcohol include methanol, ethanol, isopropanol, butanol, ethylene glycol, propylene glycol, butoxyethanol, methoxybutanol and the like. As the solvent of the application liquid used in the present invention, two or more solvents may be contained, and the two or more solvents exemplified above may be contained in combination.

The organic photoelectric conversion device of the present invention can act as an organic film solar battery by irradiating a transparent or semi-transparent electrode with light such as solar light or the like to generate photo electromotive force between electrodes.

It is also possible to integrate a plurality of organic film solar batteries to obtain an organic film solar battery module.

The organic photoelectric conversion device of the present invention can act as an organic optical sensor by irradiating a transparent or semi-transparent electrode with light under condition of application of voltage between electrodes to cause flow of photo current. It is also possible to integrate a plurality of organic optical sensors to obtain an organic image sensor.

EXAMPLES

Examples are shown below for illustrating the present invention further in detail, but the present invention is not limited to them.

In the following examples, the polystyrene-equivalent number-average molecular weight and weight-average molecular weight were determined using GPC manufactured by GPC Laboratory Co., Ltd. (PL-GPC2000) as the molecular weight of a polymer. The polymer was dissolved in o-dichlorobenzene so that the concentration of the polymer was about 1% by weight. As the mobile phase of GPC, o-dichlorobenzene was used and allowed to flow at a flow rate of 1 mL/min at a measurement temperature of 140° C. Three columns of PLGEL 10 μm MIXED-B (manufactured by PL Laboratories) were connected in series.

Synthesis Example 1

Synthesis of Compound 2

Into a 200 mL flask of which gas in the flask had been purged with argon were charged 2.00 g (3.77 mmol) of a compound 1 synthesized according to a description of International Publication WO2011/052709 and 100 mL of dehydrated tetrahydrofuran, to prepare a homogeneous solution. The solution was kept at −78° C., and 5.89 mL (9.42 mmol) of a 1.6 M n-butyllithium hexane solution was dropped into the solution over a period of 10 minutes. After dropping, the reaction liquid was stirred at −78° C. for 30 minutes, then, stirred at room temperature (25° C.) for 2 hours. Thereafter, the flask was cooled down to −78° C., and to the reaction liquid was added 3.37 g (10.4 mmol) of tributyltin chloride. After addition, the reaction liquid was stirred at −78° C. for 30 minutes, then, stirred at room temperature (25° C.) for 3 hours. Thereafter, to the reaction liquid was added 200 ml of water to stop the reaction, and ethyl acetate was added and an organic layer containing the reaction product was extracted. The organic layer was dried over sodium sulfate, and filtrated, then, the filtrate was concentrated by an evaporator, and the solvent was distilled off. The resultant oily substance was purified by a silica gel column using hexane as a developing solvent. As the silica gel of the silica gel column, silica gel which had previously been immersed in hexane containing 10% by weight of triethylamine for 5 minutes before rinsing with hexane was used. After purification, 3.55 g (3.20 mmol) of a compound 2 was obtained.

Synthesis Example 2

Synthesis of Polymer Compound 1 compound 3 compound 2 compound 4

Into a 300 mL flask of which gas in the flask had been purged with argon were charged 800 mg (0.760 mmol) of a compound 3 synthesized according to a description of International Publication WO2011/052709, 840 mg (0.757 mmol) of the compound 2, 471 mg (1.43 mmol) of a compound 4 synthesized according to a description of International Publication WO2011/052709 and 107 ml of toluene, to prepare a homogeneous solution. The resultant toluene solution was bubbled with argon for 30 minutes. Thereafter, to the toluene solution were added 19.6 mg (0.0214 mmol) of tris(dibenzylideneacetone)dipalladium and 39.1 mg (0.128 mmol) of tris(2-toluyl)phosphine, and the mixture was stirred at 100° C. for 6 hours. Thereafter, to the reaction liquid was added 660 mg of phenyl bromide, and the mixture was further stirred for 5 hours. Thereafter, the flask was cooled down to 25° C., and the reaction liquid was poured into 2000 mL of methanol. The deposited polymer was filtrated and collected, and the resultant polymer was placed in a cylindrical paper filter and extracted with methanol, acetone and hexane each for 5 hours using a Soxhlet extractor. The polymer remaining in the cylindrical paper filter was dissolved in 53 mL of o-dichlorobenzene, and 1.21 g of sodium diethyldithiocarbamate and 12 mL of water were added, and the mixture was stirred for 8 hours under reflux. An aqueous layer was removed, then, the organic layer was washed with 200 ml of water twice, then, with 200 mL of a 3% by weight acetic acid aqueous solution twice, then, with 200 mL of water twice, and the resultant solution was poured into methanol, to cause deposition of a polymer. The polymer was filtrated, then, dried, and the resultant polymer was dissolved again in 62 mL of o-dichlorobenzene, and the solution was passed through alumina/silica gel columns. The resultant solution was poured into methanol, to cause deposition of a polymer, and the polymer was filtrated, then, dried, to obtain 802 mg of a purified polymer. Hereinafter, this polymer is called a polymer compound 1.

(Production of Composition 1)

Ten parts by weight of [6,6]-phenylC61-butyric acid methyl ester (C60PCBM) (E100 manufactured by Frontier Carbon Corporation) as a derivative of a fullerene, 5 parts by weight of the polymer compound 1 as an electron donor compound and 1000 parts by weight of o-dichlorobenzene as a solvent were mixed. Next, the mixed solution was filtrated through a Teflon (registered trademark) filter having a pore diameter of 1.0 μm, to prepare a composition 1.

Example 1

(Fabrication and Evaluation of Organic Film Solar Battery)

A glass substrate carrying an ITO film formed thereon functioning as an anode of a solar battery was prepared. The ITO film had been formed by a sputtering method, and its thickness was 150 nm. This glass substrate was treated with ozone and UV, to surface-treat the ITO film. Next, a 45% by weight isopropanol dispersion of zinc oxide nanoparticles (HTD-711Z, manufactured by TAYCA Corporation) was diluted with isopentanol in an amount of 10-fold parts by weight of the dispersion, to prepare an application liquid. This application liquid was applied with a thickness of 40 nm on an active layer by spin coating, and heated at 170° C. for 10 minutes in air, to form a functional layer. On this functional layer, the composition 1 was applied by spin coating, to form an active layer (thickness: about 100 nm).

Next, Plexcore PV2000 Hole Transport Ink (purchased from Sigma Aldrich. Sulfonated polythiophene (thiophene-3-[2-(2-methoxyethoxy) ethoxy]-2,5-diyl) (S-P3MEET)

1.8% in 2-butoxyethanol:water (2:3)) was applied on the active layer by spin coating, to form a hole injection layer having a thickness of 50 nm.

Next, a wire-like conductor dispersion using a water solvent (ClearOhm (registered trademark) Ink-N AQ: manufactured by Cambrios Technologies Corporation) was applied by spin coating and dried, to obtain an anode composed of an electrically conductive wire layer having thickness of 120 nm. Thereafter, it was sealed with an UV curable sealant to obtain an organic film solar battery. A 1 cm×1 cm regular tetragonal light shielding mask was covered on the resultant organic film solar battery, and the resultant organic film solar battery was irradiated with constant light using a solar simulator (manufactured by Bunkoukeiki Co., Ltd., trade name: OTENTO-SUNII: AM 1.5 G filter, irradiance: 100 mW/cm$^2$), and the generating current and voltage were measured, to determine photoelectric conversion efficiency. The photoelectric conversion efficiency was 2.51%, the short circuit current density was 8.44 mA/cm$^2$, the open end voltage was 0.65 V and FF (fill factor) was 0.46.

Reference Example 1

(Fabrication and Evaluation of Organic Film Solar Battery)

A glass substrate carrying an ITO film formed thereon functioning as an anode of a solar battery was prepared. The ITO film had been formed by a sputtering method, and its thickness was 150 nm. This glass substrate was treated with ozone and UV, to surface-treat the ITO film. Next, a 45% by weight isopropanol dispersion of zinc oxide nanoparticles (HTD-711Z, manufactured by TAYCA Corporation) was diluted with isopentanol in an amount of 10-fold parts by weight of the dispersion, to prepare an application liquid. This application liquid was applied with a thickness of 40 nm on an active layer by spin coating, and heated at 170° C. for 10 minutes in air, to form a functional layer. On this functional layer, the composition 1 was applied by spin coating, to form an active layer (thickness: about 100 nm).

Next, a solution prepared by adding 1% by weight of a surfactant Zonyl FS-300 to AI4083 of PEDOT:PSS manufactured by Heraeus was applied on the active layer by spin coating, to form a hole injection layer having a thickness of 65 nm.

Next, a wire-like conductor dispersion using a water solvent (ClearOhm (registered trademark) Ink-N AQ: manufactured by Cambrios Technologies Corporation) was applied by spin coating and dried, to obtain an anode composed of an electrically conductive wire layer having thickness of 120 nm. Thereafter, it was sealed with an UV curable sealant to obtain an organic film solar battery. A 1 cm×1 cm regular tetragonal light shielding mask was covered on the resultant organic film solar battery, and the resultant organic film solar battery was irradiated with constant light using a solar simulator (manufactured by Bunkoukeiki Co., Ltd., trade name: OTENTO-SUNII: AM 1.5 G filter, irradiance: 100 mW/cm$^2$), and the generating current and voltage were measured, to determine photoelectric conversion efficiency. The photoelectric conversion efficiency was 0.65%, the short circuit current density was 4.98 mA/cm$^2$, the open end voltage was 0.51 V and FF (fill factor) was 0.26.

(Measurement of Residual Film Rate)

On a 1 inch square substrate, Plexcore PV2000 Hole Transport Ink (purchased from Sigma Aldrich) was applied by spin coating and dried in vacuum, to form an applied film having a thickness of 50 nm. Next, on this applied film, water was placed in a meniscus shape, and after 30 seconds, spun at 4000 rpm, to fling off the water. The applied film had a residual film rate of 100%.

On a 1 inch square substrate, a solution prepared by adding 1% by weight of a surfactant Zonyl FS-300 to AI4083 of PEDOT: PSS manufactured by Heraeus was applied by spin coating and dried in vacuum, to form an applied film having a thickness of 65 nm. Next, on this applied film, water was placed in a meniscus shape, and after 30 seconds, spun at 4000 rpm, to fling off the water. The applied film had a residual film rate of 0%.

INDUSTRIAL APPLICABILITY

The present invention provides an organic photoelectric conversion device with which high photoelectric conversion efficiency is obtained and a production method thereof. The organic photoelectric conversion device of the present invention shows high light durability.

The invention claimed is:

1. An organic photoelectric conversion device which converts light to electricity, the organic photoelectric conversion device comprising an anode, a cathode, an active layer disposed between the anode and the cathode, and a hole injection layer disposed between the anode and the active layer, wherein the anode is an electrode consisting essentially of an electrically conductive nanosubstance, and wherein the hole injection layer has a residual film rate of 80% or more as determined by a water rinse treatment described below which is conducted on a film of hole injection layer material:

on a substrate having an area of 1 square inch, the film of hole injection layer material is formed by spin coating in a thickness equivalent to the thickness of the hole injection layer in the organic photoelectric conversion device, then, a water rinse treatment is conducted in which water is placed in the form of meniscus on the film and allowed to stand still for 30 seconds, and then the film is spun at 4000 rpm to fling away water, wherein the thicknesses of the film before and after the water rinse treatment are measured by a contact type thickness meter, and (film thickness after water rinse treatment)/(film thickness before water rinse treatment)×100(%) is defined as the residual film rate of the hole injection layer;

wherein the hole injection layer comprises at least one of polyaniline and its derivatives, polythiophene and its derivatives, polypyrrole and its derivatives, polymer compounds having an aromatic amine residue as a repeating unit, aniline, thiophene, pyrrole, aromatic amine compound, CuSCN, and CuI, and wherein the organic photoelectric conversion device has a constitution in which the cathode, the active layer, the hole injection layer and the anode are laminated to each other in this order from bottom to top.

2. The organic photoelectric conversion device according to claim 1, wherein the electrically conductive nanosubstance is at least one nanosubstance selected from the group consisting of electrically conductive nanowires, electrically conductive nanotubes and electrically conductive nanoparticles.

3. The organic photoelectric conversion device according to claim 1, further having a functional layer between the cathode and the active layer.

4. The organic photoelectric conversion device according to claim 3, wherein the functional layer is a layer formed by applying an application liquid containing granulous zinc oxide.

5. The organic photoelectric conversion device according to claim 1, wherein the active layer is a layer formed by an application method.

6. The organic photoelectric conversion device according to claim 1, wherein the anode is an electrode formed by applying an application liquid containing water and a nano-substance.

7. The organic photoelectric conversion device according to claim 1, wherein the active layer contains a fullerene and/or a derivative of a fullerene and a conjugated polymer compound.

8. An organic optical sensor having the organic photoelectric conversion device according to claim 1.

* * * * *